(12) United States Patent
Miwa et al.

(10) Patent No.: US 11,009,902 B1
(45) Date of Patent: May 18, 2021

(54) POWER VOLTAGE SELECTION CIRCUIT

(71) Applicants: Ikuma Miwa, Kanagawa (JP);
Yoshifumi Mochida, Kanagawa (JP)

(72) Inventors: Ikuma Miwa, Kanagawa (JP);
Yoshifumi Mochida, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/803,946

(22) Filed: Feb. 27, 2020

(51) Int. Cl.
*G11C 11/4074* (2006.01)
*G05F 3/16* (2006.01)
*H02J 9/04* (2006.01)

(52) U.S. Cl.
CPC ............ *G05F 3/16* (2013.01); *G11C 11/4074* (2013.01); *H02J 9/04* (2013.01)

(58) Field of Classification Search
CPC .......... G05F 3/16; G05F 3/08; G11C 11/4074; H02J 9/04; Y10T 307/696
See application file for complete search history.

(56) References Cited

U.S. PATENT DOCUMENTS

| 6,774,704 B2 * | 8/2004 | Kushnarenko | G11C 8/08 327/530 |
| 2019/0187738 A1 * | 6/2019 | Neri | H02J 1/10 |

* cited by examiner

*Primary Examiner* — Jung Kim
(74) *Attorney, Agent, or Firm* — Dorsey & Whitney LLP (57) ABSTRACT

Disclosed herein is an apparatus that includes a first external terminal supplied with a first power potential, a second external terminal supplied with a second power potential different from the first power potential, a first transistor connected between the first external terminal and an internal power line, a second transistor connected between the second external terminal and the internal power line, and a first circuit configured to bring the first transistor OFF during at least a first period until the second power potential is supplied after the first power potential is supplied.

16 Claims, 6 Drawing Sheets

POWER VOLTAGE SELECTION CIRCUIT

BACKGROUND

In a semiconductor device such as a DRAM, external power to be used is sometimes switched according to operation modes. Current consumption in a low-speed operation mode can be reduced, for example, by using a predetermined external power potential supplied to a first external power terminal in a high-speed operation mode and using a different external power potential supplied to a second external power terminal and lower than the predetermined external power potential in the low-speed operation mode. However, if power is not supplied in an order defined by specifications, there is a risk of short-circuiting of the first external power terminal and the second external power terminal. Therefore, prevention of short-circuiting of the first external power terminal and the second external power terminal even in a case where power is not supplied in the order defined by the specifications is desired.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
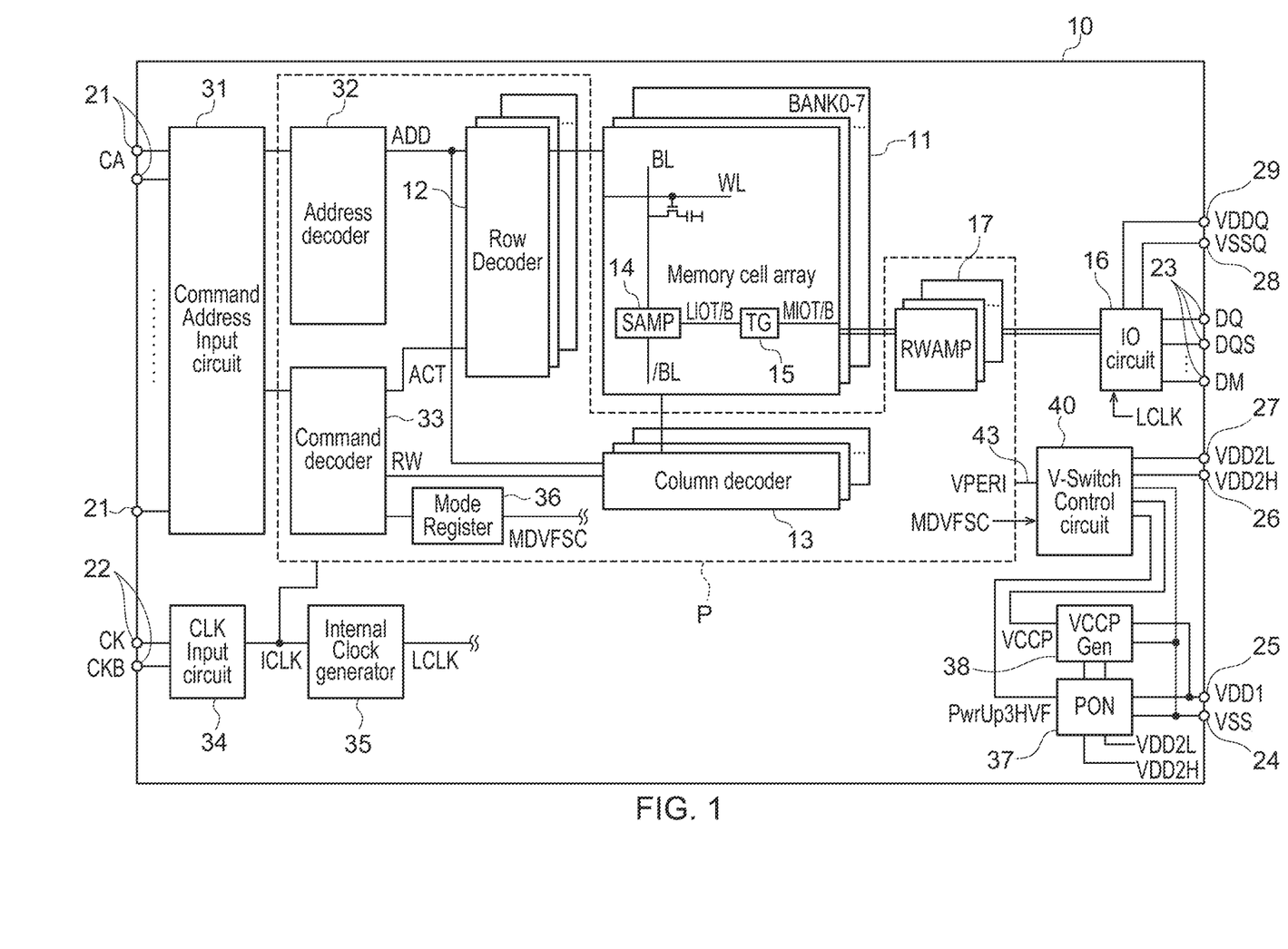
FIG. 1 is a block diagram showing a configuration of a semiconductor device according to the present disclosure.

FIG. 1 is a block diagram of a semiconductor device 10 according to one embodiment of the present disclosure. The semiconductor device 10 can be, for example, an LPDDR5 SDRAM incorporated in a single semiconductor chip. The semiconductor device 10 may be mounted on an external substrate such as a memory module substrate or a motherboard. As shown in FIG. 1, the semiconductor device 10 includes a memory cell array 11. The memory cell array 11 includes a plurality of word lines WL, a plurality of bit lines BL, and a plurality of memory cells MC placed at intersections between the bit lines BL and the word lines WL. A row decoder 12 performs selection of the word lines WL and a column decoder 13 performs selection of the bit lines BL. A sense amplifier 14 is connected to a corresponding one of the bit lines BL and a local I/O line pair LIOT/B. The local I/O line pair LIOT/B is connected to a main I/O line pair MIOT/B via a transfer gate 15 serving as a switch. The memory cell array 11 is divided into eight memory banks including memory banks BANK0 to BANK7.

A plurality of external terminals included in the semiconductor device 10 include a command address terminal 21, a clock terminal 22, a data terminal 23, and power terminals 24 to 29. The data terminal 23 is connected to an I/O circuit 16.

Command address signals CA are supplied to the command address terminal 21. A signal related to an address among the command address signals CA supplied to the command address terminal 21 is transferred to an address decoder 32 via a command address input circuit 31, and a signal related to a command is transferred to a command decoder 33 via the command address input circuit 31. The address decoder 32 decodes the address signal to generate an internal address ADD. The internal address ADD is supplied to the row decoder 12 and the column decoder 13. The command decoder 33 decodes an external command to generate an active signal ACT, a read/write signal RW, or the like. The active signal ACT is supplied to the row decoder 12 and the read/write signal RW is supplied to the column decoder 13. The command decoder 33 also updates various parameters that are set in a mode register 36.

External clock signals CK and CKB complementary to each other are supplied to the clock terminal 22. The complementary external clock signals CK and CKB are input to a clock input circuit 34. The clock input circuit 34 generates an internal clock signal ICLK based on the complementary external clock signals CK and CKB. The internal clock signal ICLK is supplied to peripheral circuits P and an internal clock generator 35. The internal clock generator 35 generates an internal clock signal LCLK based on the internal clock signal ICLK. The internal clock signal LCLK is supplied to the I/O circuit 16. The internal clock signal LCLK is used as a timing signal that defines a timing of outputting read data DQ and a strobe signal DQS from the data terminal 23 in a read operation. In a write operation, write data DQ and the strobe signal DQS are input from outside to the data terminal 23. A data mask signal DM may be input from outside to the data terminal 23 in the write operation.

Power potentials VSS, VDD1, VDD2H, and VDD2L are supplied to the power terminals 24 to 27, respectively. Levels of these power potentials have a relation: VDD1>VDD2H>VDD2L>VSS. The power potential VSS may be a ground potential. The power potentials VSS, VDD1, VDD2H, and VDD2L are supplied to a power on reset circuit 37. In a so-called power on sequence after the device is powered on, the power on reset circuit 37 activates a power on signal PwrUp3HVF to a high level in response to rising of the power potential VDD1, and inactivates the power on signal PwrUp3HVF to a low level at a predetermined timing after all the power potentials VDD1, VDD2H, and VDD2L rise. In a state until the power potential VDD1 rises, the power on signal PwrUp3HVF is at an indefinite level. The power potentials VDD1 and VDD2H are supplied also to a VCCP generator 38. The VCCP generator 38 generates an internal step-up potential VCCP based on the power potential VDD1. The internal step-up potential VCCP is higher than the power potential VDD1. The internal step-up potential VCCP may be used by the sense amplifier 14. The VCCP generator 38 brings the internal step-up potential VCCP to a predetermined level higher than that of the power potential VDD1 after all the power potentials VDD1, VDD2H, and VDD2L rise, and clamps the internal step-up potential VCCP at the same level as that of the power potential VDD2H before that time. Therefore, in a period until all the power potentials VDD1, VDD2H, and VDD2L rise after the power potential VDD2H rises, the internal step-up potential VCCP has the same level as that of the power potential VDD2H.

The power on signal PwrUp3HVF and the internal step-up potential VCCP are supplied to a V-Switch control circuit 40. The V-switch control circuit 40 selects one of the power potentials VDD2H and VDD2L based on a selection signal MDVFSC supplied from the mode register 36. The selected one of the power potentials VDD2H and VDD2L is used as an internal potential VPERI. The internal potential VPERI may be used as operation power in many load circuits included in the peripheral circuits P.

Figure 2:
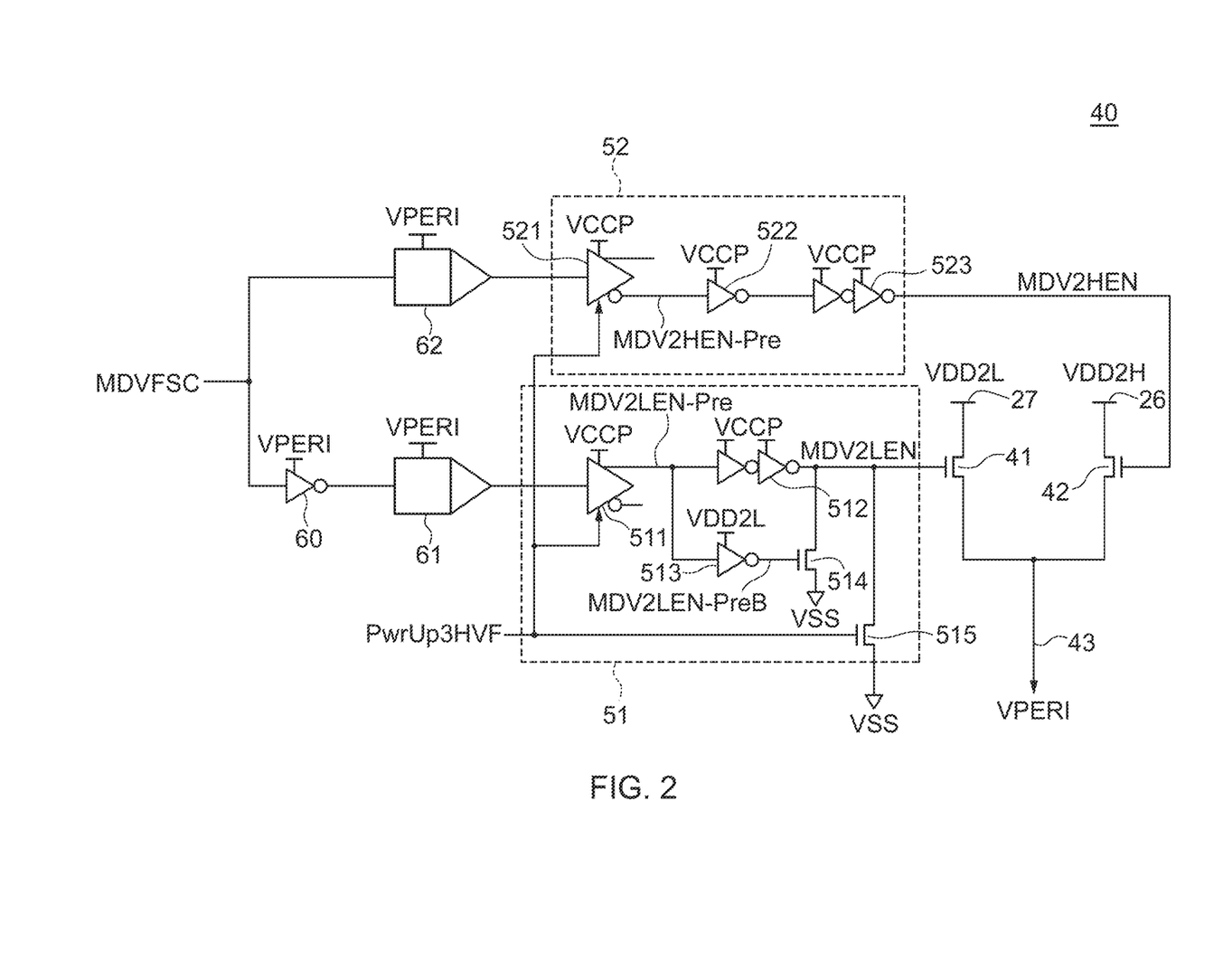
FIG. 2 is a circuit diagram of a V-Switch control circuit.

FIG. 2 is a circuit diagram of the V-Switch control circuit 40. As shown in FIG. 2, the V-Switch control circuit 40 includes a transistor 41 that supplies the power potential VDD2L to an internal power line 43 that supplies the internal potential VPERI, and a transistor 42 that supplies the power potential VDD2H to the internal power line 43. That is, the transistor 41 is connected between the power terminal 27 shown in FIG. 1 and the internal power line 43, and the transistor 42 is connected between the power terminal 26 shown in FIG. 1 and the internal power line 43. The V-Switch control circuit 40 further includes a first circuit 51 that controls the transistor 41, and a second circuit 52 that controls the transistor 42. The first circuit 51 supplies an enable signal MDV2LEN to a gate electrode of the transistor 41. The second circuit 52 supplies an enable signal MDV2HEN to a gate electrode of the transistor 42. The enable signals MDV2LEN and MDV2HEN are activated exclusively from each other. This is because the transistors 41 and 42 are both turned ON and a large current flows through between the power terminal 26 and the power terminal 27 if the enable signals MDV2LEN and MDV2HEN are both activated.

The first circuit 51 includes a level shift circuit 511, a buffer 512, an inverter 513, and transistors 514 and 515. The level shift circuit 511 converts the level of the selection signal MDVFSC supplied via an inverter 60 and a delay circuit 61. The inverter 60 and the delay circuit 61 operate on the internal potential VPERI and therefore the amplitude is VPERI (low level is VSS and high level is VPERI). Meanwhile, the buffer 512 included in the first circuit 51 operates on the internal step-up potential VCCP. The amplitude of a control signal MDV2LEN_Pre (an inversion signal of the selection signal MDVFSC) output from the level shift circuit 511 is VCCP (low level is VSS and high level is VCCP). The power on signal PwrUp3HVF is supplied to the level shift circuit 511. The level shift circuit 511 fixes the control signal MDV2LEN_Pre to a low level (VSS level) regardless of an input signal in a period in which the power on signal PwrUp3HVF is active at a high level. The buffer 512 generates the enable signal MDV2LEN by buffering the control signal MDV2LEN_Pre. The enable signal MDV2LEN is supplied to the gate electrode of the transistor 41.

The control signal MDV2LEN_Pre is supplied also to the inverter 513. The inverter 513 operates on the power potential VDD2L. Therefore, the amplitude of a control signal MDV2LEN_PreB output from the inverter 513 is VDD2L (low level is VSS and high level is VDD2L). The control signal MDV2LEN_PreB is supplied to a gate electrode of the transistor 514. The transistor 514 is connected between the gate electrode of the transistor 41 and the power terminal 24 (VSS). Accordingly, when the control signal MDV2LEN_PreB becomes a high level, the enable signal MDV2LEN is forcibly inactivated to a low level and the transistor 41 is brought to an off-state. The transistor 515 is also connected between the gate electrode of the transistor 41 and the power terminal 24 (VSS). Therefore, when the power on signal PwrUp3HVF becomes a high level, the enable signal MDV2LEN is forcibly inactivated to a low level and the transistor 41 is brought to an off-state.

The second circuit 52 includes a level shift circuit 521, an inverter 522, and a buffer 523. The level shift circuit 521 converts the level of the selection signal MDVFSC supplied via a delay circuit 62 and inverts the logical level. The amplitude of a control signal MDV2HEN_Pre (an inversion signal of the selection signal MDVFSC) output from the level shift circuit 521 is VCCP (low level is VSS and high level is VCCP). The power on signal PwrUp3HVF is supplied to the level shift circuit 521. The level shift circuit 521 fixes the control signal MDV2HEN_Pre to a low level (VSS level) regardless of an input signal in a period in which the power on signal PwrUp3HVF is active at a high level. The buffer 523 generates the enable signal MDV2HEN by buffering the control signal MDV2HEN_Pre inverted by the inverter 522. The enable signal MDV2HEN is supplied to the gate electrode of the transistor 42.

An operation of the V-Switch control circuit 40 is explained next. The V-Switch control circuit 40 turns either the transistor 41 or 42 ON based on the selection signal MDVFSC at a normal operation time, that is, in a state after the power is ON. For example, when the selection signal MDVFSC is at a high level, the enable signal MDV2HEN is at a high level and the enable signal MDV2LEN is at a low level, whereby the transistor 42 is turned ON and the transistor 41 is turned OFF. In this case, the internal power line 43 is connected to the power terminal 26 via the transistor 42 and therefore the level of the internal potential VPERI matches the power potential VDD2H. In this case, the semiconductor device 10 operates in a high-speed operation mode. On the other hand, when the selection signal MDVFSC is at a low level, the enable signal MDV2HEN is at a low level and the enable signal MDV2LEN is at a high level, whereby the transistor 41 is turned ON and the transistor 42 is turned OFF. In this case, the internal power line 43 is connected to the power terminal 27 via the transistor 41 and therefore the level of the internal potential VPERI matches the power potential VDD2L. In this case, the semiconductor device 10 operates in a low-speed operation mode. The selection signal MDVFSC can be switched by rewriting the parameters set in the mode register 36.

The delay circuits 61 and 62 execute control to delay a rising edge of an input signal and not to delay a falling edge thereof. Accordingly, at the time of switching of the selection signal MDVFSC, after one of the transistors that is in an on-state is turned OFF, the other transistor that is in an off-state is turned ON. That is, because a period in which the transistors 41 and 42 are OFF at the same time is inserted, erroneous turning ON of both the transistors 41 and 42 does not occur when the selection signal MDVFSC is switched.

On the other hand, in an initialization period immediately after power on, a state in which the transistor 42 is ON and the transistor 41 is OFF is securely provided regardless of the selection signal MDVFSC. The specifications define that power supply is to be performed in an order of VDD1, VDD2H, and VDD2L and a state in which the transistor 42 is ON and the transistor 41 is OFF is surely achieved when power is appropriately supplied in this order.

Figure 3:
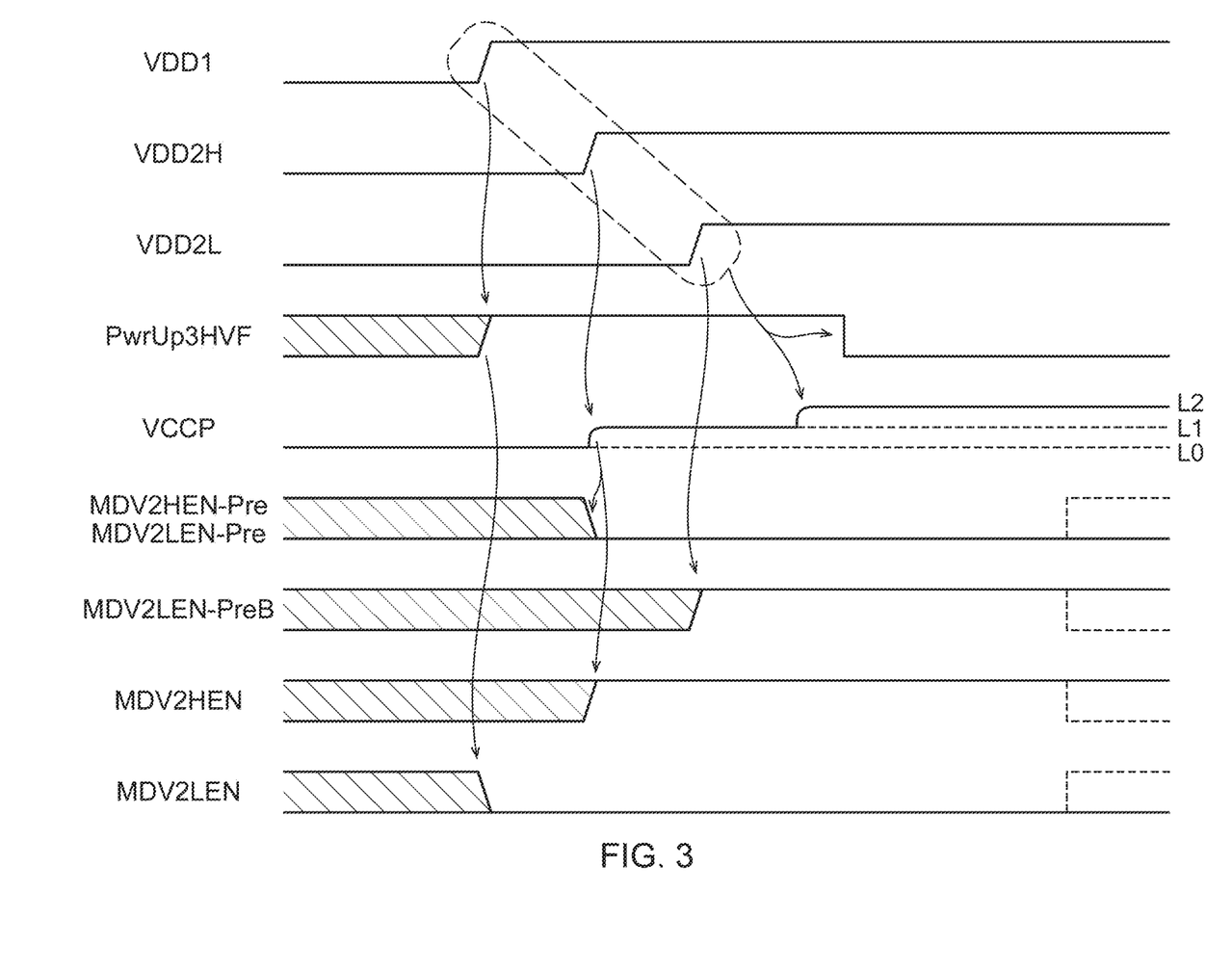
FIGS. 3 to 5 are respectively a timing chart for explaining an operation of the V-Switch control circuit in a power on sequence.

FIG. 3 is a timing chart for explaining an operation of the V-Switch control circuit 40 in a case where power is supplied in the order of VDD1, VDD2H, and VDD2L. When the power potential VDD1 is first supplied, the power on signal PwrUp3HVF becomes a high level. Because this turns the transistor 515 included in the first circuit 51 ON, the enable signal MDV2LEN is fixed to a low level. The power potential VDD2H is not supplied yet at that point of time and therefore the level of the internal step-up potential VCCP is L0 (=VSS level). When the power potential VDD2H is thereafter supplied, the level of the internal step-up potential VCCP is clamped to L1 (=VDD2H level). Accordingly, the control signals MDV2LEN_Pre and MDV2HEN_Pre at a low level are output from the level shift circuits 511 and 521, respectively. Because the control signal MDV2LEN_Pre is input to the buffer 512 that operates on the internal step-up potential VCCP, the enable signal MDV2LEN at a low level is output from the buffer 512. The transistor 515 is already ON at that point of time and therefore the transistor 41 maintains the off-state. Meanwhile, because the control signal MDV2HEN_Pre is input to the buffer 523 via the inverter 522, the enable signal MDV2HEN at a high level is output from the buffer 523. Accordingly, the transistor 42 is turned ON. When the power potential VDD2L is supplied next, the inverter 513 is activated and the control signal MDV2LEN_PreB becomes a high level, so that the transistor 514 is turned ON. Because the transistor 515 is already ON at that point of time, the transistor 41 maintains the off-state. In response to power supply of all of VDD1, VDD2H, and VDD2L, the internal step-up potential VCCP is stepped up to an original step-up potential L2 and the power on signal PwrUp3HVF changes to a low level. Accordingly, the transistor 515 is turned OFF and the level shift circuits 511 and 521 perform a level shift operation. However, because the selection signal MDVFSC is at a high level being an initial value at that point of time, the state in which the transistor 41 is OFF and the transistor 42 is ON is maintained.

When power is supplied in an appropriate order of VDD1, VDD2H, and VDD2L, the state in which the transistor 41 is OFF and the transistor 42 is ON is realized and the state in which the transistors 41 and 42 are both ON does not occur. When power is supplied in an order of VDD1, VDD2L, and VDD2H, the transistor 514 is turned ON before the buffer 512 is activated. The transistor 515 is already ON at that point of time and the enable signal MDV2LEN is kept at a low level. Therefore, the V-Switch control circuit 40 operates in an identical manner to that in the example shown in FIG. 3.

Figure 4:
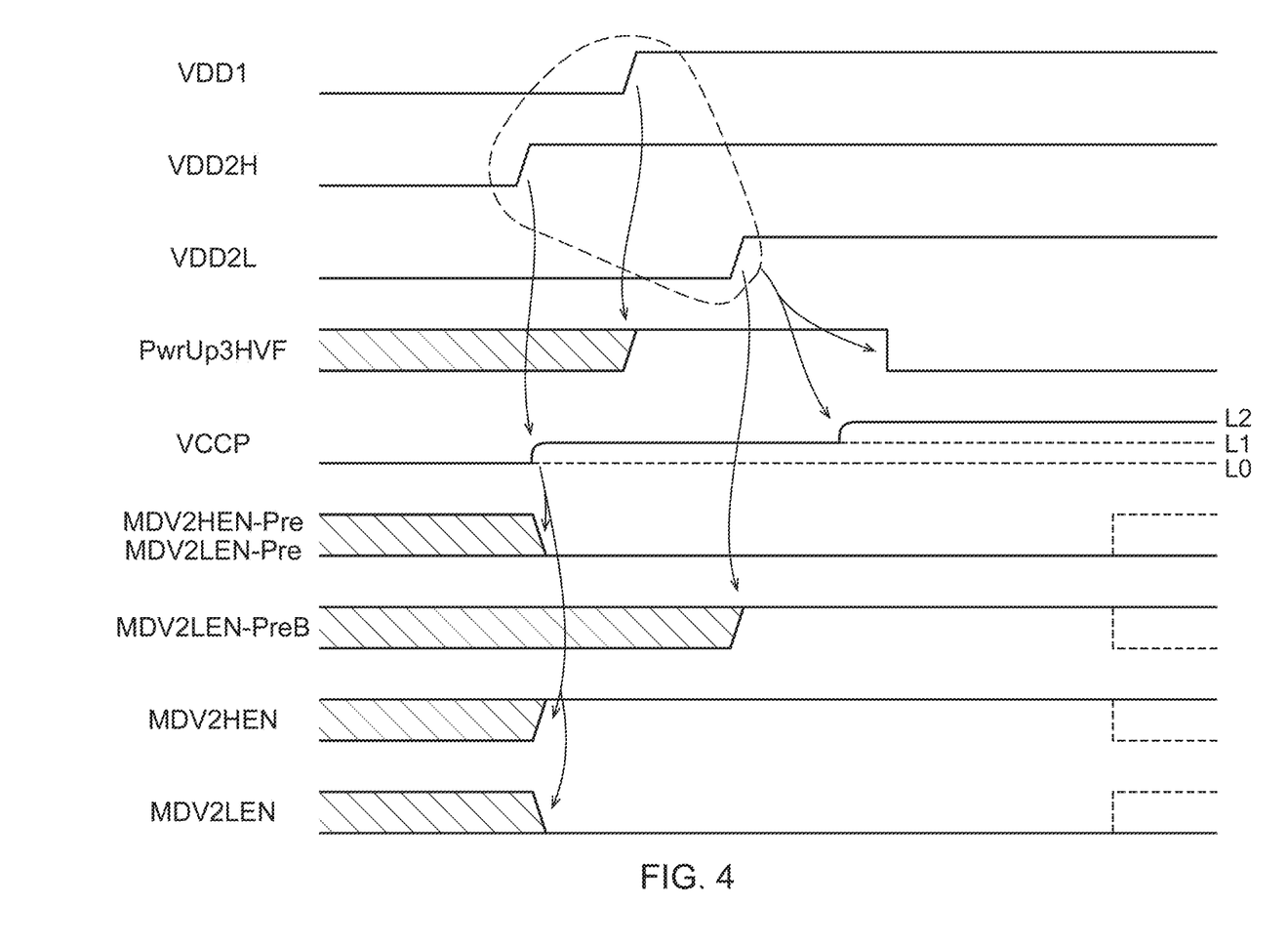

FIG. 4 is a timing chart for explaining an operation of the V-Switch control circuit 40 in a case where power is supplied in an order of VDD2H, VDD1, and VDD2L. When the power potential VDD2H is first supplied, the level of the internal step-up potential VCCP is clamped to L1 (=VDD2H level). Accordingly, the control signals MDV2LEN_Pre and MDV2HEN_Pre at a low level are output from the level shift circuits 511 and 521, respectively. The control signal MDV2LEN_Pre is input to the buffer 512 that operates on the internal step-up potential VCCP and therefore the enable signal MDV2LEN at a low level is output from the buffer 512. Accordingly, the transistor 41 is turned OFF. Meanwhile, the control signal MDV2HEN_Pre is input to the buffer 523 via the inverter 522 and thus the enable signal MDV2HEN at a high level is output from the buffer 523. Accordingly, the transistor 42 is turned ON. When the power potential VDD1 is supplied next, the power on signal PwrUp3HVF becomes a high level. Because this turns the transistor 515 included in the first circuit 51 ON, the enable signal MDV2LEN is fixed to a low level. When the power potential VDD2L is supplied next, the inverter 513 is activated and the control signal MDV2LEN_PreB becomes a high level, whereby the transistor 514 is turned ON. In response to power supply of all of VDD1, VDD2H, and VDD2L, the internal step-up potential VCCP is stepped up to the original step-up potential L2 and the power on signal PwrUp3HVF changes to a low level. This turns the transistor 515 OFF and the level shift circuits 511 and 521 perform a level shift operation. Because the selection signal MDVFSC is at a high level being the initial value at that point of time, the state in which the transistor 41 is OFF and the transistor 42 is ON is maintained.

As described above, even when power is supplied in an illegal order of VDD2H, VDD1, and VDD2L, the state in which the transistor 41 is OFF and the transistor 42 is ON is realized by the buffer 512, the inverter 522, and the buffer 523 that operate on the step-up potential VCCP, and the state in which both the transistors 41 and 42 are ON does not occur. When power is supplied in an order of VDD2H, VDD2L, and VDD1, the transistor 514 is turned ON before the transistor 515 is turned ON. However, because the enable signal MDV2LEN is kept at a low level by the buffer 512 at that point of time, the V-Switch control circuit 40 operates in an identical manner to that in the example shown in FIG. 4.

Figure 5:
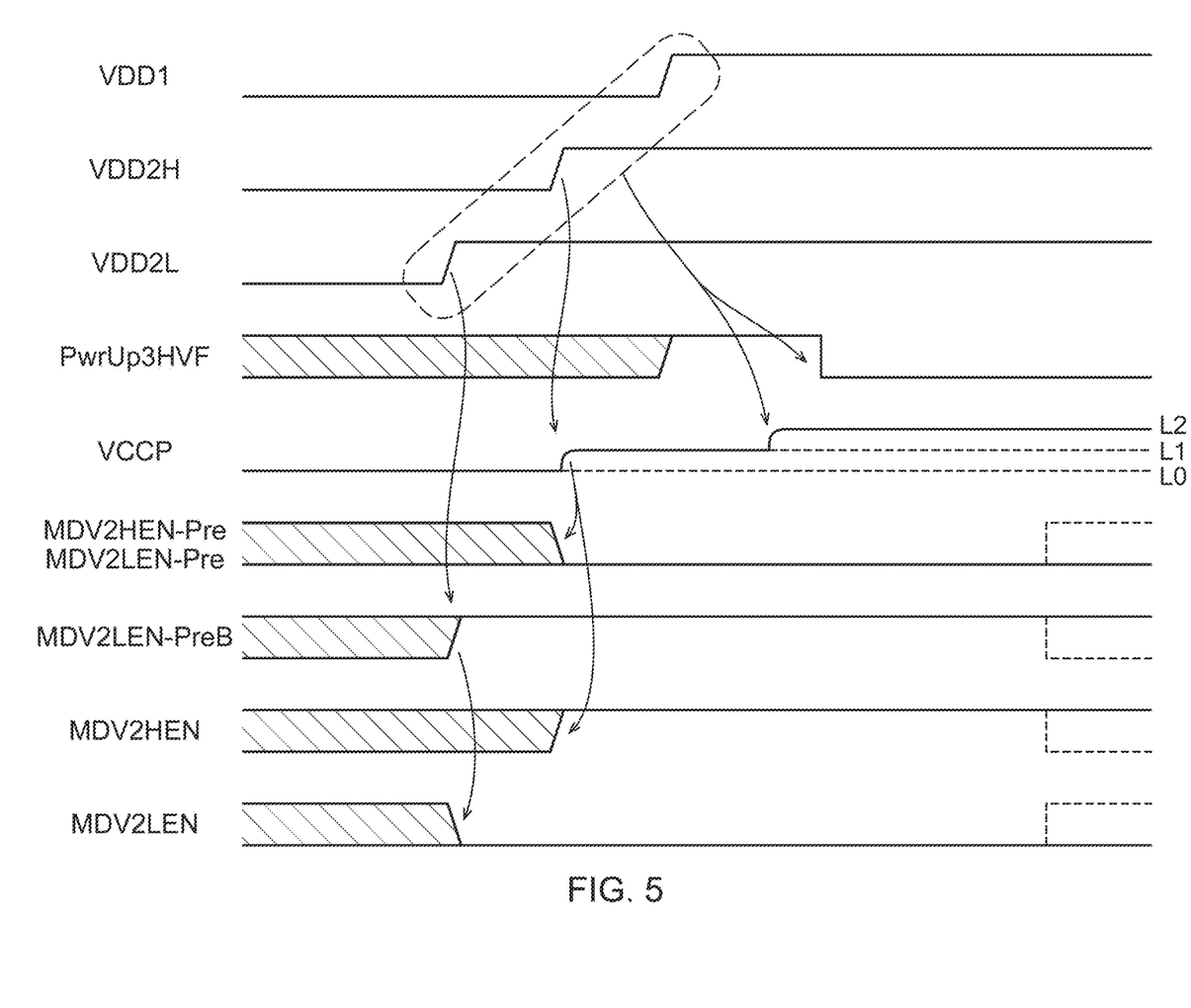

FIG. 5 is a timing chart for explaining an operation of the V-Switch control circuit 40 in a case where power is supplied in an order of VDD2L, VDD2H, and VDD1. When the power potential VDD2L is first supplied, the inverter 513 is activated and the control signal MDV2LEN_PreB becomes a high level and therefore the transistor 514 is turned ON. Accordingly, the enable signal MDV2LEN is fixed to a low level. When the power potential VDD2H is supplied next, the level of the internal step-up potential VCCP is clamped to L1 (=VDD2H level). Therefore, the control signals MDV2LEN_Pre and MDV2HEN_Pre at a low level are output from the level shift circuits 511 and 521, respectively. This enables to maintain the off-state of the transistor 41 and turns the transistor 42 ON. When the power potential VDD1 is supplied next, the power on signal PwrUp3HVF becomes a high level. Accordingly, the transistor 515 included in the first circuit 51 is turned ON. However, because the enable signal MDV2LEN is already at a low level at that point of time, no changes occur. In response to power supply of all of VDD1, VDD2H, and VDD2L, the internal step-up potential VCCP is stepped up to the original step-up potential L2 and the power on signal PwrUp3HVF changes to a low level. This turns the transistor 515 OFF and the level shift circuits 511 and 521 perform a level shift operation. However, because the selection signal MDVFSC is at a high level being the initial value at that point of time, the state in which the transistor 41 is OFF and the transistor 42 is ON is maintained.

Even when power is supplied in an illegal order of VDD2L, VDD2H, and VDD1 as described, the transistor 41 can be promptly fixed to an off-state by the inverter 513 and the transistor 514. When the power is supplied in an order of VDD2L, VDD1, and VDD2H, the transistor 515 is turned ON before the buffer 512 is activated. However, the enable signal MDV2LEN is kept at a low level by the transistor 514 at that point of time. Therefore, the V-switch control circuit 40 operates in an identical manner to that in the example shown in FIG. 5.

As described above, according to the present embodiment, even when the power potentials VDD1, VDD2H, and VDD2L are supplied in any order, the transistor 41 and the transistor 42 are not turned ON at the same time.

Figure 6:
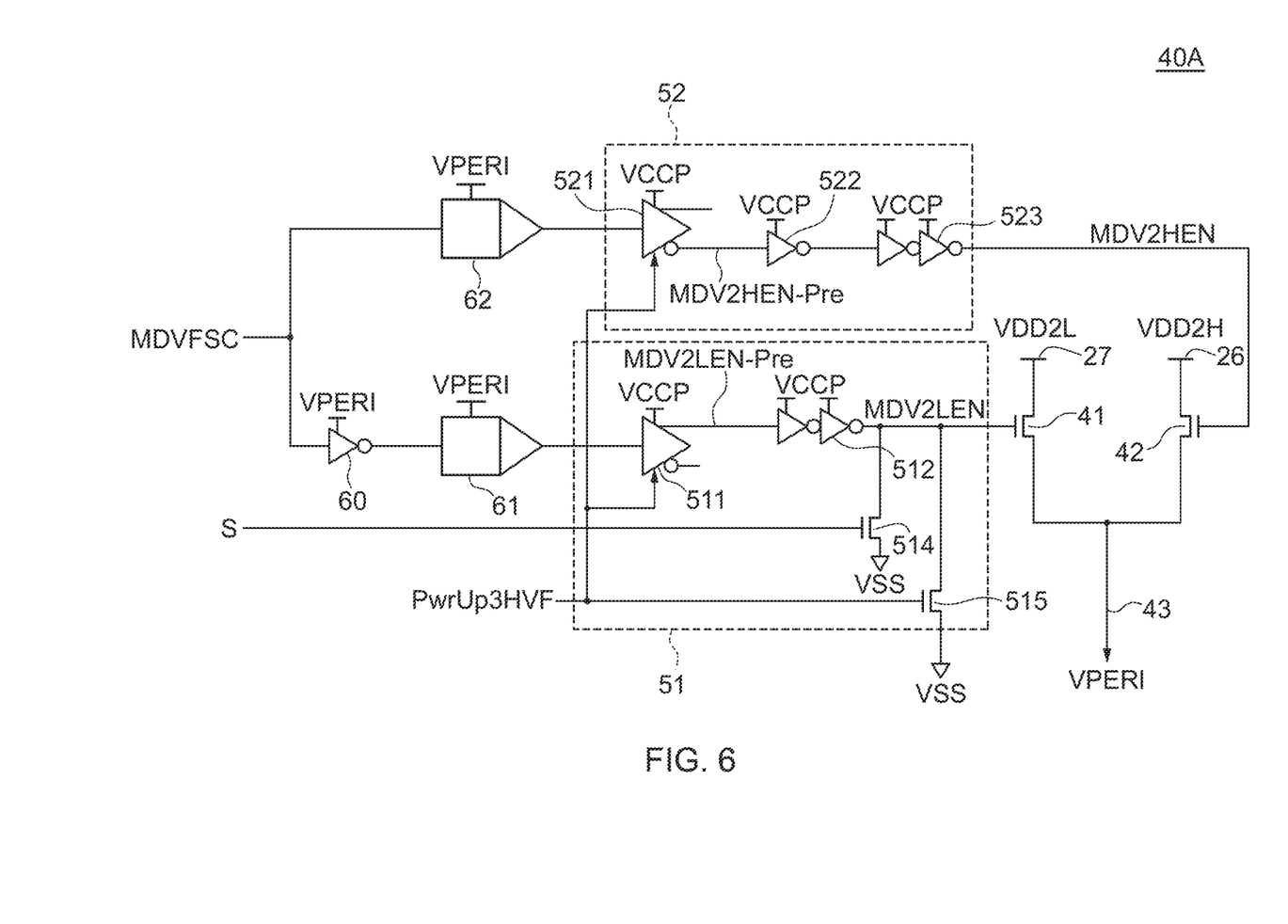
FIG. 6 is a circuit diagram of a V-Switch control circuit according to a modification.

FIG. 6 is a circuit diagram of a V-Switch control circuit 40A according to a modification. The V-Switch control circuit 40A shown in FIG. 6 is different from the V-Switch control circuit 40 shown in FIG. 2 in that a control signal S is supplied to the gate electrode of the transistor 514. The control signal S is a signal activated to a high level in response to supply of the power potential VDD2L. The V-Switch control circuit 40A shown in FIG. 6 also can perform the same operation as that of the V-Switch control circuit 40 shown in FIG. 2. However, because a plurality of the transistors 41 and 42 are provided on a chip and are placed dispersedly on the chip, a line for supplying the control signal S becomes long in the V-Switch control circuit 40A shown in FIG. 6. Therefore, an area occupied by the V-Switch control circuit 40 shown in FIG. 2 is smaller.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
a first external terminal supplied with a first power potential;
a second external terminal supplied with a second power potential different from the first power potential;
a first transistor connected between the first external terminal and an internal power line;
a second transistor connected between the second external terminal and the internal power line; and
a first circuit configured to turn the first transistor OFF for at least a first period and until the first power potential is supplied after the second power potential is supplied, wherein during the first period, the first transistor is maintained at the off-state regardless of whether the first power potential is supplied to the first external terminal or the second power potential is supplied to the second external terminal.

2. The apparatus of claim 1, further comprising a second circuit configured to turn the second transistor ON for at least a second period and until a selection signal changes from an initial state to a selection state for selecting the first power potential after the second power potential is supplied.

3. The apparatus of claim 2, wherein the second circuit is configured to turn the second transistor OFF when the selection signal changes from the initial state to the selection state.

4. The apparatus of claim 3, wherein the second circuit is configured to keep the second transistor ON when the selection signal keeps the initial state.

5. The apparatus of claim 2, wherein the first circuit includes:
a third transistor connected between a control electrode of the first transistor and a third external terminal supplied with a third power potential different from the first and second power potentials; and a first driver circuit configured to turn the third transistor ON during at least the first period.

6. The apparatus of claim 5, wherein the first circuit further includes a second driver circuit configured to turn the first transistor OFF during the second period.

7. The apparatus of claim 6, wherein the first driver circuit operates on the first power potential.

8. The apparatus of claim 7, wherein the second driver circuit operates on the second power potential.

9. The apparatus of claim 8,
wherein the second driver circuit includes a level shift circuit and a buffer circuit,
wherein the level shift circuit is configured to drive an output signal based on the selection signal, and configured to fix the output signal in an inactive state during the second period, and
wherein the buffer circuit is connected between the level shift circuit and the control electrode of the first transistor such that the buffer circuit is configured to control the first transistor based on the output signal of the level shift circuit.

10. The apparatus of claim 9, wherein the third transistor is configured to be controlled by the output signal of the level shift circuit.

11. The apparatus of claim 10, further comprising a fourth external terminal supplied with a fourth power potential different from the first, second and third power potentials,
wherein the first circuit further includes a fourth transistor connected between the control electrode of the first transistor and the third external terminal, and
wherein the fourth transistor is configured to turn ON during at least a third period until the first and second power potentials are supplied after the fourth power potential is supplied.

12. The apparatus of claim 6, further comprising a mode register configured to supply the selection signal to the first and second circuits.

13. The apparatus of claim 12, wherein the mode register operates on an internal potential supplied from the internal power line.

14. The apparatus of claim 1, wherein the first power potential is lower than the second power potential.

15. An apparatus comprising:
a first external terminal supplied with a first power potential;
a second external terminal supplied with a second power potential different from the first power potential;
a first transistor connected between the first external terminal and an internal power line;
a second transistor connected between the second external terminal and the internal power line;
a first circuit configured to turn the first transistor OFF during at least a first period until the first power potential is supplied after the second power potential is supplied, and
a second circuit configured to turn the second transistor ON during at least a second period until a selection signal changes from an initial state to a selection state for selecting the first power potential after the second power potential is supplied,
wherein the first circuit includes:
a third transistor connected between a control electrode of the first transistor and a third external terminal supplied with a third power potential different from the first and second power potentials;
a first driver circuit configured to turn the third transistor ON during at least the first period; and a second driver circuit configured to turn the first transistor OFF during the second period, wherein the first driver circuit operates on the first power potential, wherein the second driver circuit operates on the second power potential, wherein the second driver circuit includes a level shift circuit and a buffer circuit, wherein the level shift circuit is configured to drive an output signal based on the selection signal, and configured to fix the output signal in an inactive state diming the second period, and wherein the buffer circuit is connected between the level shift circuit and the control electrode of the first transistor such that the buffer circuit is configured to control the first transistor based on the output signal of the level shift circuit.

16. An apparatus comprising:
a first external terminal supplied with a first power potential;
a second external terminal supplied with a second power potential different from the first power potential;
a first transistor connected between the first external terminal and an internal power line;
a second transistor connected between the second external terminal and the intergyral power line;
a first circuit configured to turn the first transistor OFF during at least a first period until the first power potential is supplied after the second power potential is supplied;
a second circuit configured to turn the second transistor ON during at least a second period until a selection signal changes from an initial state to a selection state for selecting the first power potential after the second power potential is supplied; and
a mode register configured to supply the selection signal to the first and second circuits,
wherein the first circuit includes:
    a third transistor connected between a control electrode of the first transistor and a third external terminal supplied with a third power potential different from the first and second power potentials;
    a first driver circuit configured to turn the third transistor ON during at least the first period; and
    a second driver circuit configured to turn the first transistor OFF during the second period, and
wherein the mode register operates on an internal potential supplied from the internal power line.

* * * * *